United States Patent
Yoshida et al.

(10) Patent No.: US 10,897,102 B2
(45) Date of Patent: Jan. 19, 2021

(54) CONNECTOR STRUCTURE

(71) Applicants: TOYOTA JIDOSHA KABUSHIKI KAISHA, Toyota (JP); AUTONETWORKS TECHNOLOGIES, LTD., Yokkaichi (JP); SUMITOMO WIRING SYSTEMS, LTD., Yokkaichi (JP); SUMITOMO ELECTRIC INDUSTRIES, LTD., Osaka (JP)

(72) Inventors: Kaoru Yoshida, Toyoake (JP); Kazuya Kitatani, Toyota (JP); Ryutaro Yamazaki, Toyota (JP); Hiroki Keino, Toyota (JP); Keigo Takahashi, Yokkaichi (JP)

(73) Assignees: TOYOTA JIDOSHA KABUSHIKI KAISHA, Toyota (JP); AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(*) Notice: Subject to any disclaimer, the term of this patent is extended or adjusted under 35 U.S.C. 154(b) by 0 days.

(21) Appl. No.: 16/477,541

(22) PCT Filed: Dec. 12, 2017

(86) PCT No.: PCT/JP2017/044569
§ 371 (c)(1),
(2) Date: Jul. 12, 2019

(87) PCT Pub. No.: WO2018/146937
PCT Pub. Date: Aug. 16, 2018

(65) Prior Publication Data
US 2019/0356080 A1 Nov. 21, 2019

(30) Foreign Application Priority Data

Feb. 8, 2017 (JP) .................................. 2017-021462

(51) Int. Cl.
*H01R 13/52* (2006.01)
*G01R 1/04* (2006.01)
*H01R 13/646* (2011.01)

(52) U.S. Cl.
CPC ............... *H01R 13/52* (2013.01); *G01R 1/04* (2013.01); *H01R 13/646* (2013.01)

(58) Field of Classification Search
CPC .. H01R 13/52; H01R 13/521; H01R 13/5216; H01R 13/5219; H01R 13/646; G01R 1/04
See application file for complete search history.

(56) References Cited

U.S. PATENT DOCUMENTS 2,619,515 A * 11/1952 Doane ................. H01R 13/4536
439/274
2,858,518 A * 10/1958 Chrystie ................ H01R 13/02
439/426

(Continued)

FOREIGN PATENT DOCUMENTS

CN 202560150 U 11/2012
JP S56-135671 U 10/1981

(Continued)

*Primary Examiner* — Oscar C Jimenez
(74) *Attorney, Agent, or Firm* — Oliff PLC

(57) ABSTRACT

A connector structure includes a connector body that includes wiring in an internal section; an opening of the connector body, the opening being positioned to overlap the wiring when being viewed in a predetermined direction, the opening communicating with the internal section; and a probe holding mechanism in the opening, the probe holding mechanism blocking up the opening. The probe holding mechanism is configured to have a probe inserted through the probe holding mechanism in the predetermined direction (Continued)

and is configured to, when the probe is inserted through the probe holding mechanism, deform and hold the probe.

4 Claims, 5 Drawing Sheets

(56) References Cited

U.S. PATENT DOCUMENTS

| | | | | |
|---|---|---|---|---|
| 3,522,576 A | * | 8/1970 | Cairns | H01R 13/523 |
| | | | | 439/201 |
| 3,571,779 A | * | 3/1971 | Collier | H01R 9/28 |
| | | | | 439/587 |
| 4,299,434 A | * | 11/1981 | Ishikawa | H01R 24/40 |
| | | | | 439/391 |
| 5,557,212 A | * | 9/1996 | Isaac | G01R 1/04 |
| | | | | 324/750.16 |
| 6,227,900 B1 | * | 5/2001 | Heise | H01R 13/5216 |
| | | | | 439/276 |
| 6,281,690 B1 | * | 8/2001 | Frey | G01R 1/06772 |
| | | | | 324/754.07 |
| 6,293,815 B1 | | 9/2001 | Daoud | |
| 2004/0263189 A1 | * | 12/2004 | Perry | G01R 1/04 |
| | | | | 324/750.27 |
| 2005/0191899 A1 | * | 9/2005 | Solano | H01R 13/521 |
| | | | | 439/519 |
| 2007/0122697 A1 | * | 5/2007 | Wutz | H01M 2/30 |
| | | | | 429/180 |
| 2009/0250885 A1 | * | 10/2009 | Sasaki | H01R 13/521 |
| | | | | 277/627 |
| 2010/0303453 A1 | | 12/2010 | Haeberer et al. | |

FOREIGN PATENT DOCUMENTS

| | | |
|---|---|---|
| JP | 2008-186598 A | 8/2008 |
| JP | 2016-018760 A | 2/2016 |
| JP | 2016-091794 A | 5/2016 |

* cited by examiner

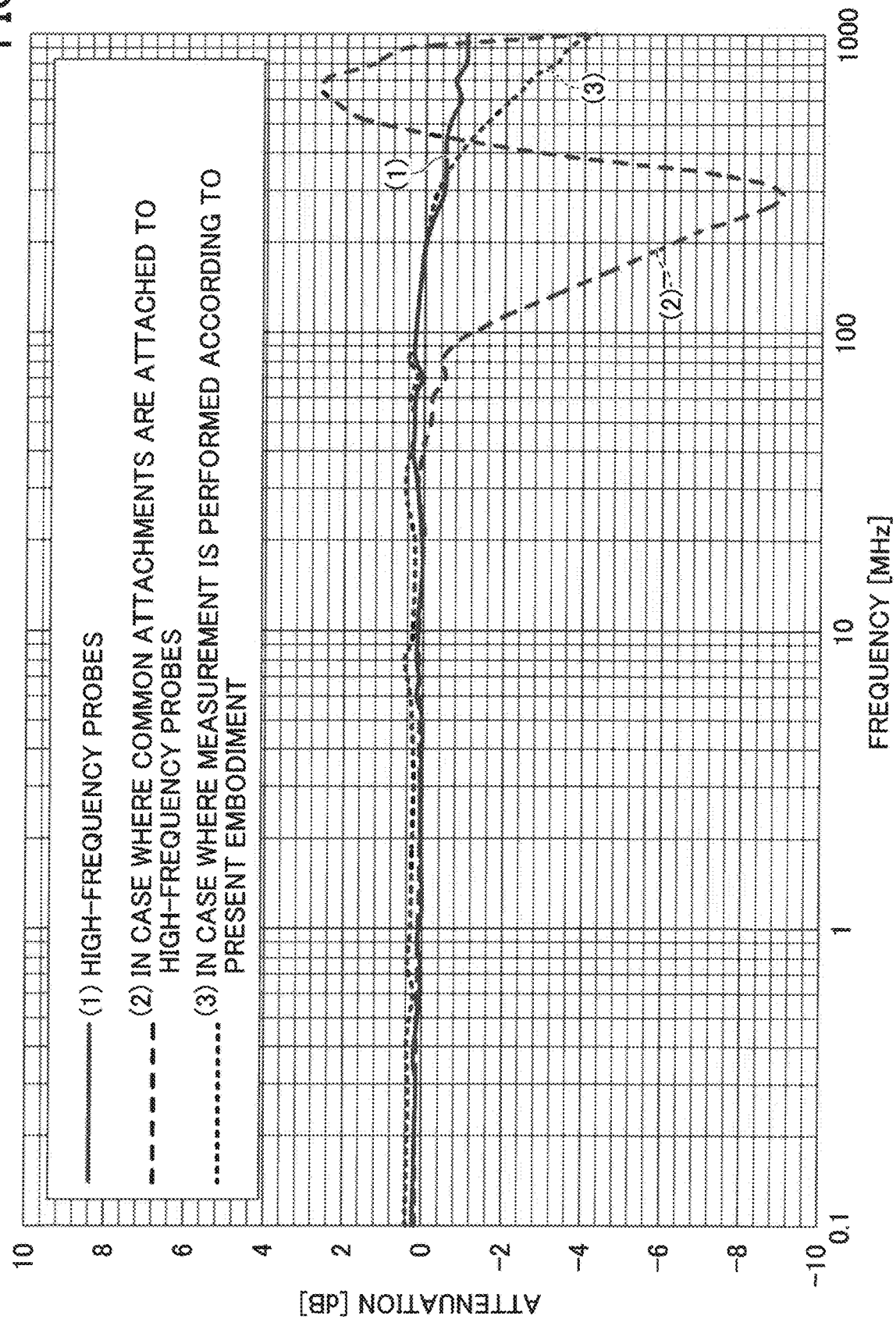

CONNECTOR STRUCTURE

TECHNICAL FIELD

The disclosure relates to a connector structure.

BACKGROUND ART

A technology concerning electrical connectors that are locked with one another in a primary locking state and a secondary locking state is known. According to the technology, in response to unlocking of the electrical connectors from the secondary lock state, an opening for a probe enables checking of electrical continuity of electrical wires inside the connector body (see Patent Document No. 1, for example). According to the technology, the electrical continuity may be checked without compromising water resistance of the connectors.

PRIOR ART DOCUMENT

Patent Document

Patent Document No. 1: Japanese Laid-Open Patent Application No. 2016-091794

SUMMARY OF THE INVENTION

Problem to be Solved by the Invention

However, the prior art described above does not include a mechanism for holding the probe during measurement; holding the probe with a common attachment such as a clip or the like degrades the frequency characteristics, particularly for a high-frequency band.

According to one aspect, an object of the present invention is to provide a connector structure having a mechanism for holding a probe during measurement.

Means for Solving the Problem

According to the aspect, a connector structure is provided which includes:

a connector body that includes wiring in an internal section;

an opening of the connector body, the opening being positioned to overlap the wiring when being viewed in a predetermined direction, the opening communicating with the internal section; and a probe holding mechanism in the opening, the probe holding mechanism blocking up the opening.

The probe holding mechanism is configured to have a probe inserted through the probe holding mechanism in the predetermined direction and is configured to, when the probe is inserted through the probe holding mechanism, deform and hold the probe.

Advantageous Effect of the Invention

Thanks to the aspect, a connector structure having a mechanism for holding a probe during measurement is obtained.

BRIEF DESCRIPTION OF THE DRAWINGS

FIG. 8 illustrates frequency characteristics during measurement according to the present embodiment.

MODE FOR CARRYING OUT THE INVENTION

Hereinafter, each embodiment will be described in detail with reference to the accompanying drawings.

Figure 1:
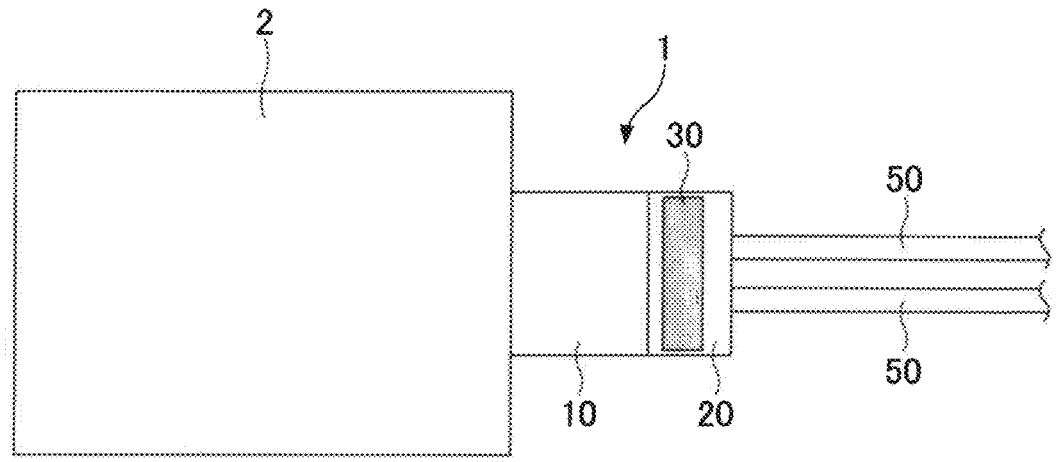
FIG. 1 is a schematic diagram illustrating a communication device 2 including a connector structure 1 according to an embodiment.

FIG. 1 is a schematic diagram illustrating a communication device 2 including a connector structure 1 according to an embodiment.

The connector structure 1 includes a male connector 20 coupled to a female connector 10 of the communication device 2.

The connector 20 is for high-frequency communication of higher than or equal to 10 MHz and is used, for example, for Ethernet (a registered trade mark). Communication wires 50 are used. One end of the communication wires 50 is connected to the connector 20; the other end is connected to another communication device via a similar connector 20.

The connector 20 includes a probe holding mechanism 30 for holding probes during measurement. The probe holding mechanism 30 will be described in detail with reference to FIGS. 2-8.

Figure 2:
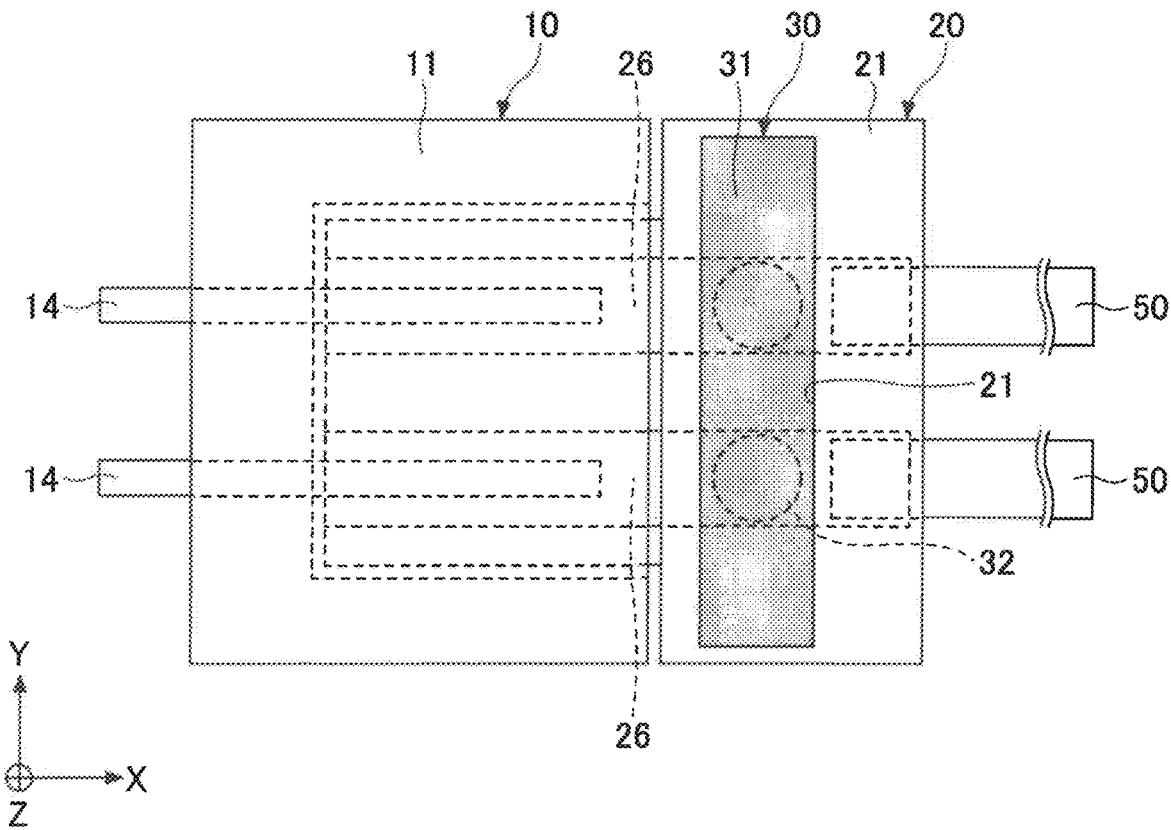
FIG. 2 is a top view of the connector structure 1.
Figure 3:
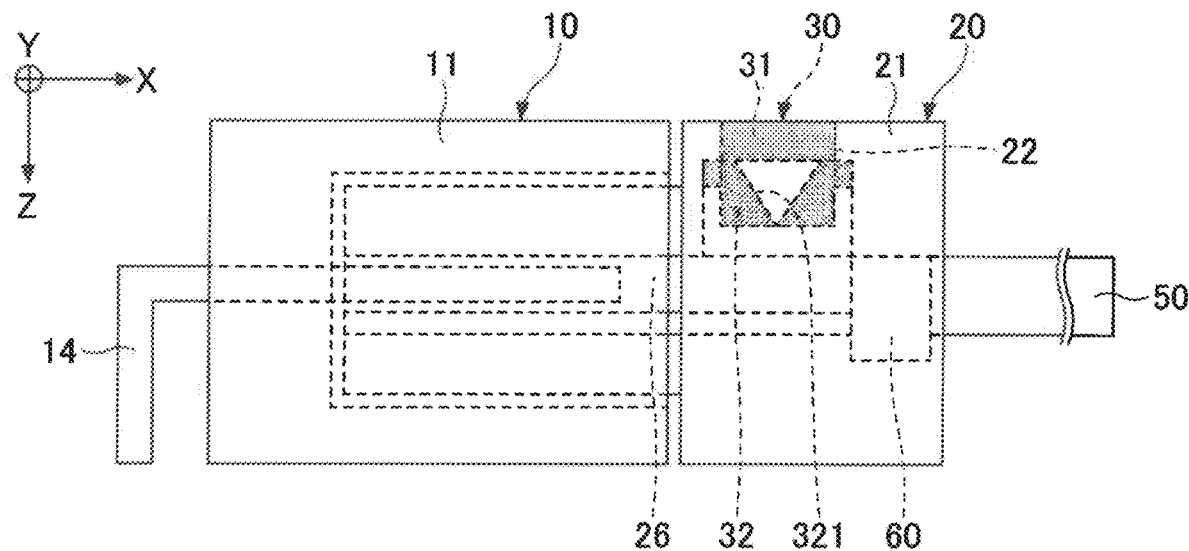
FIG. 3 is a side view of the connector structure 1.

FIG. 2 illustrates a top view of the connector structure 1; FIG. 3 illustrates a side view of the connector structure 1. FIGS. 2 and 3 are schematic diagrams where only the outer shapes of a connector body 11 of the connector 10 and a connector body 21 of the connector 20 are illustrated; the respective internal sections of the connector body 11 and the connector body 21 are illustrated in a see-through manner. In FIGS. 2 and 3, for the sake of identifying easier, the probe holding mechanism 30 is hatched. In FIGS. 2 and 3, X, Y, and Z directions are defined. Hereinafter, a "Z forward direction" refers to the forward direction (the direction of the arrow) of the Z-direction.

The connector 20 includes the connector body 21, an opening 22, and terminals 26 (an example of wiring).

The connector body 21 is made of, for example, a resin material.

The opening 22 in the connector body 21 is positioned to overlap the terminals 26 when being viewed in the Z-direction. In the example illustrated in FIG. 2, the opening 22 communicates with the internal section of the connector body 21. That is, in the connector body 21, the internal section communicates with the outside via the opening 22. Except the opening 22, the connector body 21 may be externally sealed.

The terminals 26 are conductors and are installed in the internal section of the connector body 21. The terminals 26 have tubular shapes extending in the X direction and are electrically connected with the connector 10 when pins 14, which are conductors, of the connector 10 are inserted. The pins 14 of the connector 10 are electrically connected to a substrate (not illustrated) or the like included in the communication device 2. The communication wires 50 are electrically connected to the other end of the terminals 26 (the end opposite the end electrically connected to the pins 14). The terminals 26 are electrically connected with the communication wires 50 through, for example, a swaging process (see a swaging portion 60). In the example illustrated in FIG. 2, the two terminals 26 are arranged side by side in the Y-direction.

The probe holding mechanism 30 is installed in the opening 22. The probe holding mechanism 30 is fitted into the connector body 21 for example. In this regard, the probe holding mechanism 30 is fitted into the connector body 21 in such a manner that the probe holding mechanism 30 can be removed from the opening 22 with the use of a tool or the like. The probe holding mechanism 30 is configured to have probes 90 inserted through the probe holding mechanism 30 in the Z-direction (see FIG. 5) and is configured to, in response to insertion of the probes, deform and hold the probes 90 (see FIG. 5). This function will be described later with reference to FIG. 5.

The probe holding mechanism 30 is made of, for example, a resin material. The probe holding mechanism 30 includes a first member 31 and a second member 32. The first member 31 and the second member 32 may be formed separately and connected together with an adhesive or the like. The second member 32 is on the side of the first member 31 nearer to the internal section of the connector body 21.

The first member 31 has a shape corresponding to the shape of the opening 22 in the top view (when being viewed in the Z-direction) and blocks up the opening 22. The first member 31 may have the same thickness in the Z-direction as the thickness of the connector body 21 in the Z-direction around the opening 22.

The second member 32 is installed in the connector body 21 and is positioned to overlap the terminals 26 when being viewed in the Z-direction. The second member 32 includes hollowed portions 321 that hollow in the Z-direction toward the internal section (in the forward Z-direction). That is, the second member 32 includes the hollowed portions 321 which hollow in the forward Z-direction in the side view (when being viewed in the Y-direction). The hollowed portions 321 have conic inner surfaces having apexes in the forward Z-direction. Thus, the conic spaces are provided by the hollowed portions 321 between the first member 31 and the second member 32. The bottoms of the hollowed portions 321 (the apexes in the forward Z-direction) may have small through holes and may have no through holes.

Figure 4:
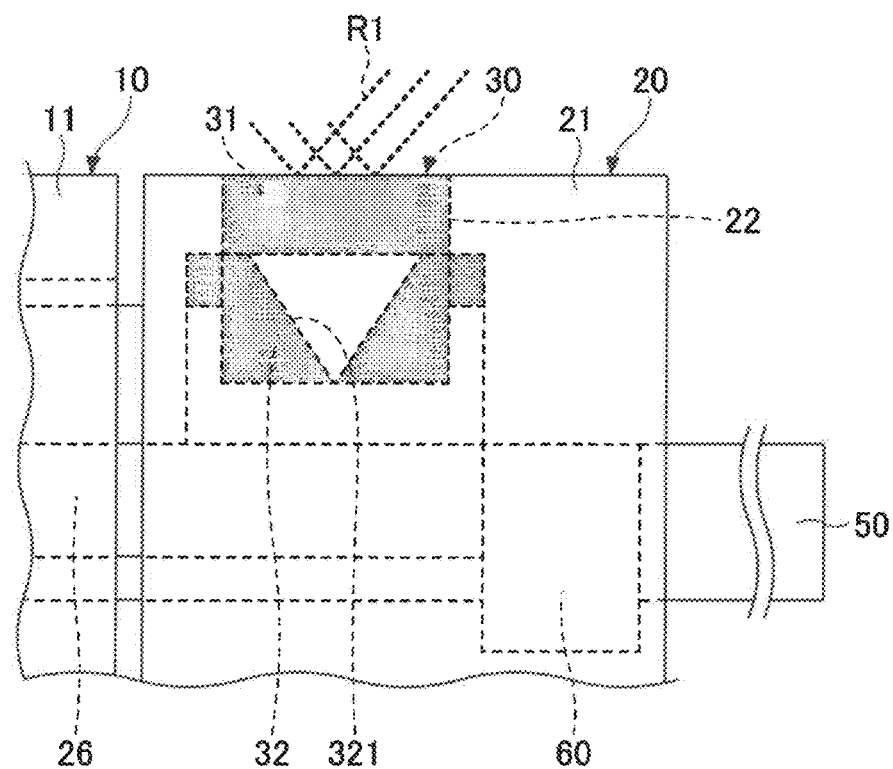
FIG. 4 illustrates a waterproof and dustproof function of a probe holding mechanism 30.

FIG. 4 illustrates a waterproof and dustproof function of the probe holding mechanism 30 and corresponds to a magnified partial view of the side view of FIG. 3. In FIG. 4, a state of foreign matter such as water or dust coming in is schematically indicated by the arrows R1.

The first member 31 has a function to prevent entry of foreign matter such as water into the internal section of the connector body 21 through the opening 22 as illustrated by the arrows R1 in FIG. 4. That is, the first member 31 serves as a protective cover. In order to improve the function, the first member 31 does not have any through holes extending in the Z direction.

Figure 5:
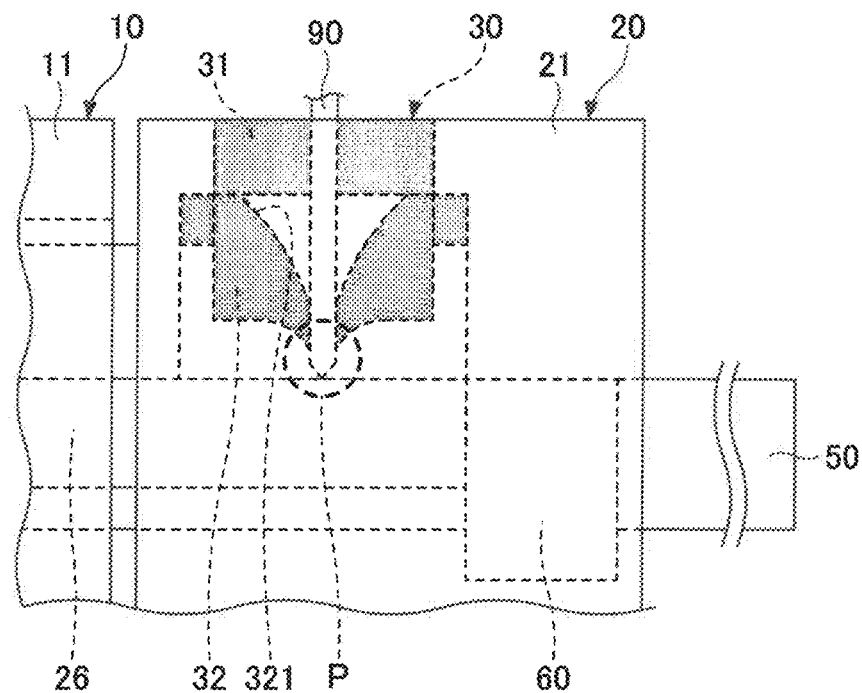
FIG. 5 illustrates a probe holding function of the probe holding mechanism 30.
Figure 6:
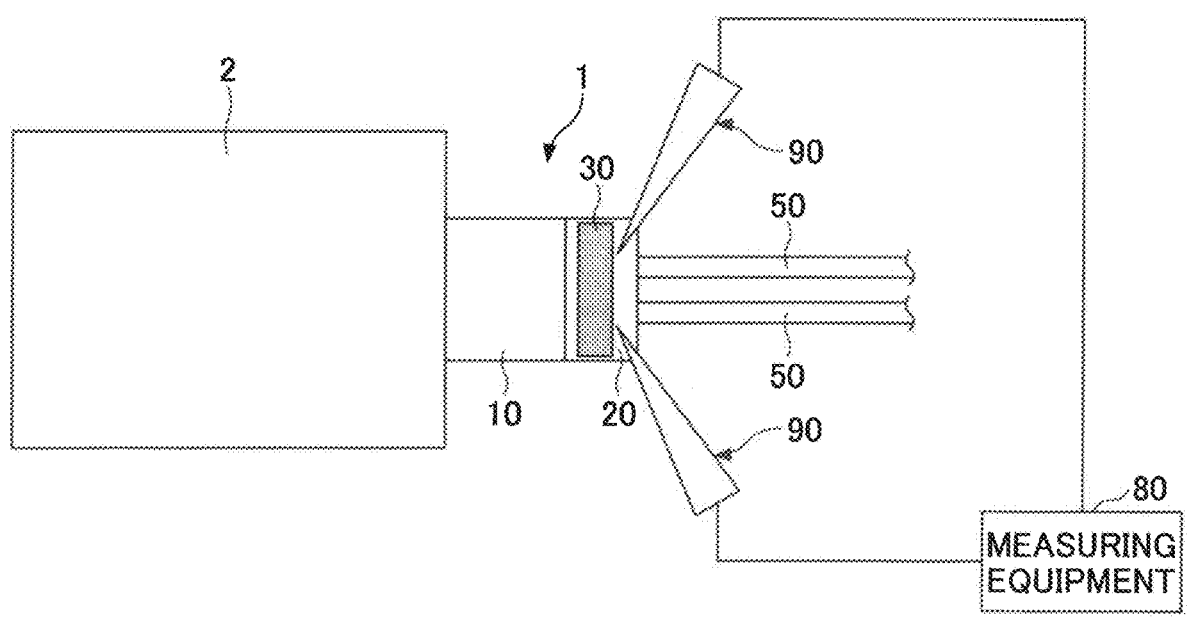
FIG. 6 schematically illustrates a state of measurement with the use of probes 90.

FIG. 5 illustrates the probe holding function of the probe holding mechanism 30 and corresponds to a magnified partial view of the side view of FIG. 3. FIG. 5 schematically illustrates a state where a portion (a needle portion) of the probe 90 has been inserted. FIG. 6 is a diagram schematically illustrating a state of measurement by the probes 90.

A purpose of measurement performed with the use of the probes 90 is to determine, on the basis of the state of a communication signal (a high-frequency signal) transmitted or received via the terminals 26, whether a malfunction has occurred. The terminals 26 are suitable for measuring the state of the communication signal. This is because, if the communication wires 50 are used instead, the outer skins of the communication wires 50 would be broken to implement precise measurement. FIG. 6 schematically illustrates a state of measurement using the two probes 90 connected to measuring equipment 80. FIG. 5 illustrates the state of the probe holding mechanism 30 and the internal section of the connector body 21 during measurement illustrated in FIG. 6.

The probes 90 can reach the internal section of the connector body 21 after being inserted through the first member 31 and the second member 32 in the Z-direction, as illustrated in FIG. 5. Thus, the probes 90 can proceed up to the position of coming into contact with the terminals 26 illustrated in FIG. 5.

At this time, as illustrated at the position P of FIG. 5, the first member 31 is configured to hold end sections of the probes 90 by deforming when the probes 90 are inserted through the first member 31. Also the second member 32 is configured to come into contact with the circumferential surfaces of the probes 90 in radius sections of the probes 90 when the probes 90 are inserted through the second member 32. This improves the holding functions for the probes 90 during measurement, because each of the probes 90 is held at the two points distant along the Z-direction. In particular, because the first member 31 is configured to hold the probes 90 near the terminals 26, it is possible to efficiently improve the holding functions for the probes 90 during measurement and implement stable contact.

Because the second member 32 has the hollowed portions 321 as described above, the resistance generated when the probes 90 are inserted in the probe holding mechanism 30 may be reduced, whereby it is possible to reduce the impact applied to the position at which the connector 20 mates with the connector 10. This reduces an influence on measurement caused by the impact (see FIG. 8). Also, because the second member 32 has the hollowed portions 321 as described above, the hollowed portions 321 guide the probes 90 to be inserted so that the probes 90 can be easily inserted in place.

Figure 7:
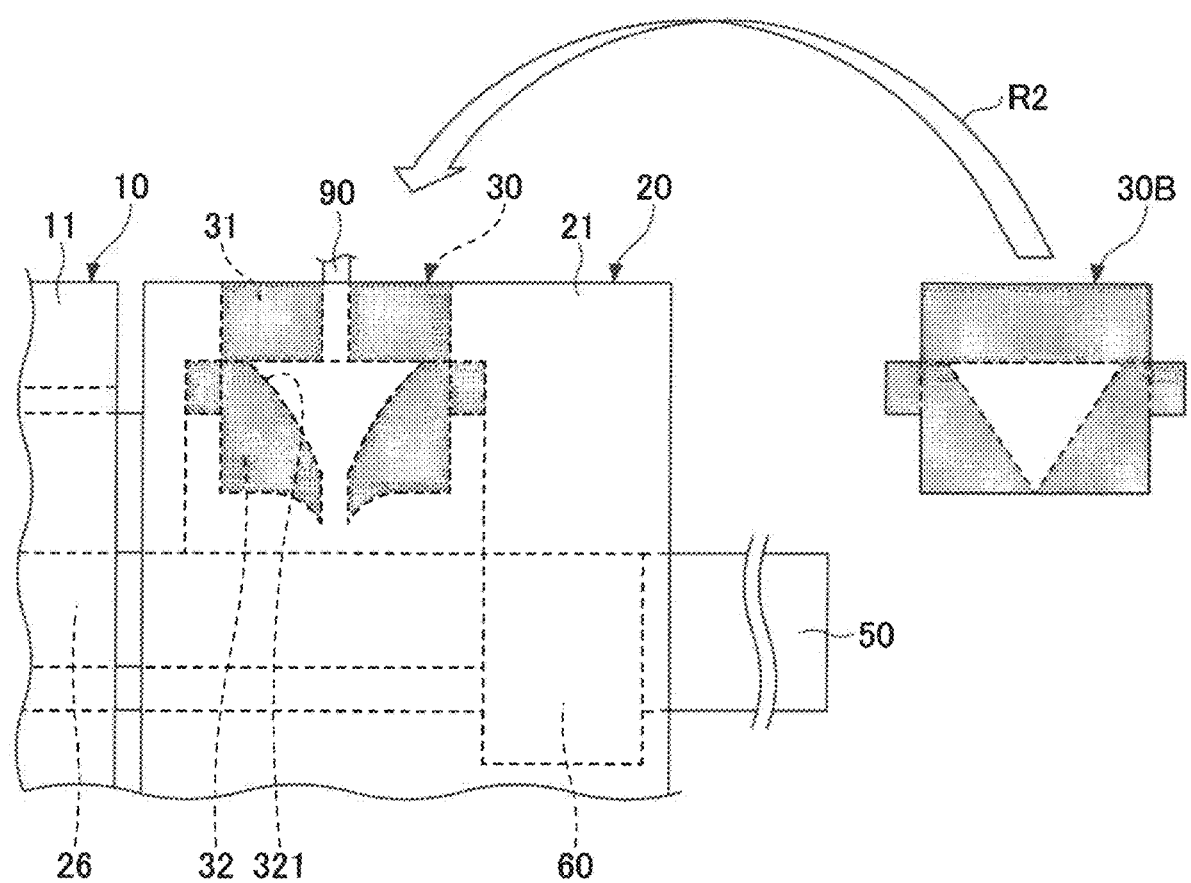
FIG. 7 illustrates a replacing function of the probe holding mechanism 30.

FIG. 7 illustrates a replacement function of the probe holding mechanism 30 and corresponds to a magnified partial view of the side view of FIG. 3.

As illustrated in FIG. 7, upon completion of measurement by the probes 90, the first member 31 of the probe holding mechanism 30 has the through holes and the second member 32 has deformed, whereby the waterproof and dustproof function is lost. Because the probe holding mechanism 30 can be easily removed by a tool or the like, the probe holding mechanism 30 can easily be replaced with a new probe holding mechanism 30B, as illustrated schematically by an arrow R2 in FIG. 7. This ensures that, after measurement using the probes 90, the waterproof and dustproof function can be restored through replacement of minimal parts.

FIG. 8 illustrates frequency characteristics of measurement according to the present embodiment. FIG. 8 illustrates frequency characteristics obtained by the probes 90 held by the probe holding mechanism 30 according to the present embodiment as a waveform (3) where the ordinate axis is used for attenuation and the abscissa axis is used for frequency. FIG. 8 illustrates also a waveform (1) of frequency characteristics of the probes 90 themselves and a waveform (2) of frequency characteristics of the probes 90 obtained when common attachments such as clips or the like are used.

As illustrated by the waveform (1) of FIG. 8, the impedances of the capacitors that the probes 90 generally have are inversely proportional to a frequency assuming that the capacitors are ideal capacitors. However, in actuality, the impedances may be affected by various parasitic components.

Even in a case of using the probes 90 for high frequency that have the managed frequency characteristics, the frequency characteristics would vary greatly if attachments or the like are attached for measurement; that would affect the measurement as illustrated by the waveform (2) of FIG. 8. For a high-frequency band, the addition of even a few pF capacitance caused by the probes 90 may alter the frequency characteristics and thus may make it difficult to implement accurate measurement. This means that, for a high-frequency band, the stability of contact between the probes 90 and measuring targets and any substances inserted between the probes 90 and the measuring targets may easily affect measurement.

In this regard, according to the present embodiment, as described above, by using the probe holding mechanism 30, it is possible to effectively improve the holding function for the probes 90 during measurement and implement stable contact. Actually, according to the present embodiment, the frequency characteristics for the high-frequency band are improved as illustrated by the waveform (3) of FIG. 8. Specifically, a result of improving the frequency characteristics by 8.6 dB for, for example, the frequency of 300 MHz was obtained.

Although each embodiment has been described in detail, the present invention is not limited to the specific embodiments. Various modifications and changes can be made within the scope defined by the claims. It is also possible to combine all or some of the elements of the above-described embodiments.

The present application claims the priority to the basic application 2017-021462 filed with the Japanese Patent Office on Feb. 8, 2017, the entire contents of which are hereby incorporated by reference.

DESCRIPTION OF REFERENCE SINGS

1 Connector structure
2 Communication device
10 Connector
11 Connector body
14 Pin
20 Connector
21 Connector body
22 Opening
26 Terminal
30 Probe holding mechanism
31 First member
32 Second member
50 Communication wire
80 Measuring equipment
90 Probe
321 Hollowed portion

The invention claimed is:

1. A connector structure comprising:
a connector body that includes wiring in an internal section;
an opening of the connector body, the opening being positioned to overlap the wiring when being viewed in a predetermined direction, the opening communicating with the internal section; and
a probe holding mechanism in the opening, the probe holding mechanism blocking up the opening,
wherein
the probe holding mechanism is configured to have a probe inserted through the probe holding mechanism in the predetermined direction and is configured to, when the probe is inserted through the probe holding mechanism, deform and hold the probe and to hold the probe at two points that are distant from each other along the predetermined direction,
the probe holding mechanism includes a first member and a second member on a side of the first member nearer to the internal section of the connector body, and
the first member is configured not to have a through hole extending in the predetermined direction, in a state where the probe is not inserted through the first member, so as to seal the opening,
the second member includes a hollowed portion, the hollowed portion hollowing in the predetermined direction toward the internal section, and
the hollowed portion has a conic inner surface having an apex in the predetermined direction, the conic inner surface having symmetry with respect to an axis perpendicular to the predetermined direction with edges thereof converging, to the apex, along the predetermined direction.

2. The connector structure as claimed in claim 1, wherein the connector structure is configured to be used for high-frequency communication of higher than or equal to 10 MHz.

3. The connector structure as claimed in claim 2, wherein the wiring includes a terminal to which a communication wire from outside of the connector body is electrically connected, and
the opening is positioned to overlap the terminal when being viewed in the predetermined direction.

4. The connector structure as claimed in claim 1, wherein the second member is configured to deform when the probe is inserted through the second member.

* * * * *